United States Patent
Föll et al.

(10) Patent No.: US 7,486,080 B2
(45) Date of Patent: Feb. 3, 2009

(54) METHOD AND DEVICE FOR VERIFYING AN ELECTRICAL COUPLING STATE OF AN INDUCTIVE LOAD

(75) Inventors: Albrecht Föll, Regensburg (DE); Jose Kissler, Bad Abbach (DE); Thomas Röhrl, Barbing (DE)

(73) Assignee: Siemens Aktiengesellschaft, Munich (DE)

( * ) Notice: Subject to any disclaimer, the term of this patent is extended or adjusted under 35 U.S.C. 154(b) by 273 days.

(21) Appl. No.: 11/391,984

(22) Filed: Mar. 29, 2006

(65) Prior Publication Data
US 2006/0224338 A1  Oct. 5, 2006

(30) Foreign Application Priority Data
Mar. 29, 2005  (DE) .................. 10 2005 014 210

(51) Int. Cl.
 *G01R 31/08* (2006.01)
 *G01R 31/04* (2006.01)
(52) U.S. Cl. .................. 324/522; 324/523; 324/538
(58) Field of Classification Search ................ 324/522, 324/523, 538
See application file for complete search history.

(56) References Cited

U.S. PATENT DOCUMENTS

| | | | |
|---|---|---|---|
| 4,589,401 A * | 5/1986 | Karim et al. ............... | 123/479 |
| 4,932,246 A * | 6/1990 | Deutsch et al. ............ | 73/119 A |
| 5,153,809 A | 10/1992 | Nurakami | |
| 5,304,935 A * | 4/1994 | Rathke et al. ............... | 324/451 |
| 5,384,539 A * | 1/1995 | Morbe et al. ................ | 324/546 |
| 6,107,926 A * | 8/2000 | Kifuku et al. ............... | 324/546 |
| 6,232,781 B1 * | 5/2001 | Goser et al. ................. | 324/422 |
| 6,664,802 B2 * | 12/2003 | Wimmer et al. ............. | 324/772 |

FOREIGN PATENT DOCUMENTS

| | | |
|---|---|---|
| DE | 40 35 571 A1 | 5/1991 |
| EP | 0 309 753 A1 | 4/1989 |
| JP | 8250329 A | 9/1996 |

* cited by examiner

*Primary Examiner*—Timothy J Dole
(74) *Attorney, Agent, or Firm*—Laurence A. Greenberg; Werner H. Stemer; Ralph E. Locher

(57) ABSTRACT

An electrical coupling state is monitored between an inductive load and a circuit configuration. The latter has a first and a second coupling point for coupling to the inductive load. A first voltage value is determined between the first and second coupling points. The first voltage value is tested for the occurrence of a characteristic voltage pulse, which can be triggered by reduction of a magnetic flux in the inductive load by way of a steep-edged change in the amount of current flow through the inductive load. An error is identified in the coupling state if the characteristic voltage pulse does not occur within a predefinable time period. The absence of an error in the coupling state is also identified if the voltage pulse does occur.

9 Claims, 3 Drawing Sheets

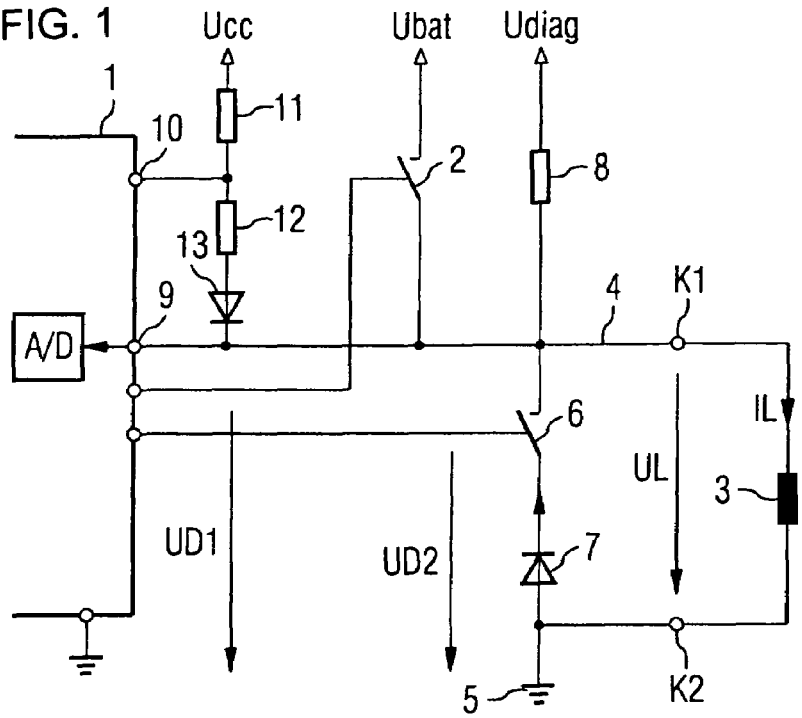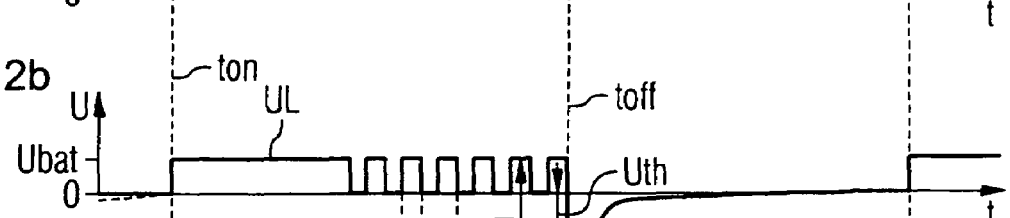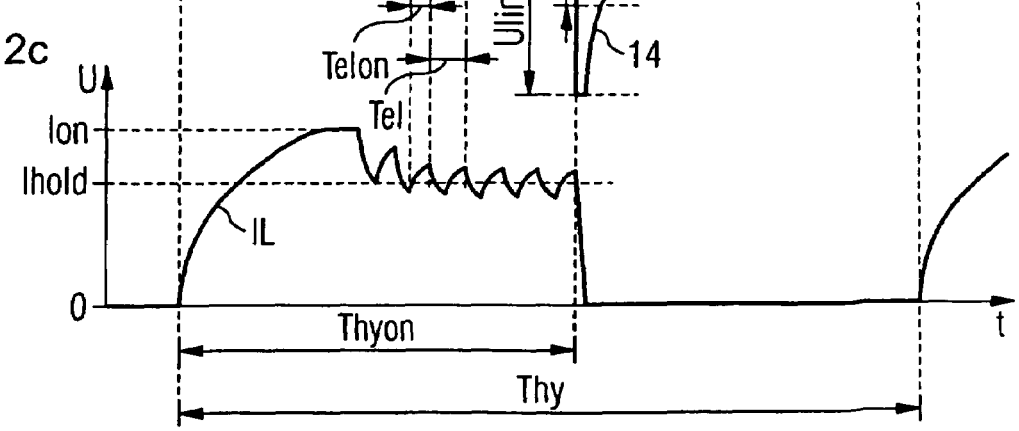

METHOD AND DEVICE FOR VERIFYING AN ELECTRICAL COUPLING STATE OF AN INDUCTIVE LOAD

BACKGROUND OF THE INVENTION

Field of the Invention

The invention relates to a method and a corresponding device for verifying an electrical coupling state between an inductive load and a circuit configuration, having a first and second coupling point for coupling to the inductive load.

An inductive load, by way of example, is an electromagnet in a valve. Depending on the electrical activation of the valve or the electromagnet, the valve opens, e.g. due to attraction of the valve armature, or closes, in that the valve armature is moved back to its initial position. Such valves are provided in vehicle transmission systems for example to open or close hydraulic channels. Vehicle transmission systems should be operated as smoothly and with as little wear as possible. To this end the valves of the vehicle transmission system are preferably activated with pulse width modulation. The inertia of the valve armature and the pulse duty factor of the pulse width modulated activation mean that a flow through the valve can be set, which is between a flow through the closed valve and a flow through the fully open valve.

High-speed valves are configured such that the inertia of the valve armature is low, to allow rapid opening or closing of the high-speed valve. The high-speed valve is for example activated continuously for a few milliseconds to achieve full opening of the valve. The high-speed valve is then activated with pulse width modulation such that the high-speed valve remains fully opened. For rapid closure of the high-speed valve the magnetic flux in the electromagnet of the high-speed valve must be rapidly reduced. To this end the electric current flow through the electromagnet of the high-speed valve is correspondingly reduced.

In motor vehicles in particular it is imperative to be able to verify the coupling state between the electromagnet of the valve or high-speed valve, i.e. the inductive load, and a circuit configuration for activating the inductive load or to a control unit, to ensure that the vehicle operates in a manner that causes as little wear as possible, whilst conserving resources and reducing emissions.

European published patent application EP 0 309 753 A1 discloses a method for monitoring an inductive load. A sensing resistor is connected in series with the inductive load. Each time the inductive load is connected, shortly after connection and shortly after the point when a reference value is achieved with an intact circuit, the current in the sensing resistor is compared with the reference value. The reference value is selected such that with an intact circuit on the first scan it is greater and on the second scan it is smaller than or equal to the current. If this is not the case, there is an error.

SUMMARY OF THE INVENTION

It is accordingly an object of the invention to provide a method and a device for monitoring an electrical coupling state of an inductive load which overcomes the disadvantages and shortcomings of the heretofore-known devices and methods of this general type.

With the foregoing and other objects in view there is provided, in accordance with the invention, a method of verifying an electrical coupling state between an inductive load and a circuit configuration, wherein the circuit configuration is coupled to the inductive load via first and second coupling points, and the method comprises:

determining a first voltage value between the first and second coupling points;

testing the first voltage value for an occurrence of a characteristic voltage pulse that can be triggered by a reduction of a magnetic flux in the inductive load by way of a steep-edged change in an amount of current flow through the inductive load;

if the characteristic voltage pulse does not occur within a predefined time period, identifying an error in the coupling state; and if the characteristic voltage pulse occurs, identifying that no error is present in the coupling state.

In other words, the objects of the invention are satisfied with a method and a corresponding device for monitoring an electrical coupling state between an inductive load and a circuit configuration, having a first and a second coupling point for coupling to the inductive load. A first voltage value is detected between the first and second coupling points. The first voltage value is verified for the occurrence of a characteristic voltage pulse, which can be triggered by reduction of the magnetic flux in the inductive load by means of a steep-edged change in the amount of current flow through the inductive load. It is identified that there is an error in the coupling state, if the characteristic voltage pulse does not occur within a predefinable time period. It is also identified that there is no error in the coupling state, if the voltage pulse occurs.

The characteristic voltage pulse is a response by the inductive load to the steep-edged change in the current flow in the inductive load. The invention is based on the knowledge that the characteristic voltage pulse always occurs when the current flow in the inductive load is changed in a steep-edged manner. The advantage is that the error in the coupling state can be reliably identified if the characteristic voltage pulse does not occur. A further advantage is that the coupling state of the inductive load can be verified during operation, if the inductive load is activated during operation such that the steep-edged change in the amount of current flow in the inductive load occurs. It is then not necessary to interrupt operation to verify the coupling state.

In an advantageous embodiment of the invention the predefinable time period starts with the steep-edged change in the amount of current flow. This is particularly advantageous, if the time is known when the amount of current flow changes in a steep-edged manner. This means that the first voltage value only has to be detected, if the characteristic voltage pulse can occur. The predefinable time period is preferably selected such that the characteristic voltage pulse can be reliably detected. This ensures that the error in the coupling state can be identified very simply and reliably, if the characteristic voltage pulse fails to occur after the steep-edged change in the amount of current flow.

In a further advantageous embodiment of the invention the predefinable time period comprises at least one activation cycle of the inductive load. An activation cycle starts or ends for example with the expected steep-edged change in the amount of current flow. The activation cycle can however also be predefined differently but comprises at least one expected steep-edged change in the amount of current flow. This ensures that the error in the coupling state can be identified very simply and reliably, if the characteristic voltage pulse fails to occur during the predefinable time period. This is particularly advantageous if the time of the steep-edged change in the amount of current flow is not known but the amount of current flow is changed in a steep-edged manner in every activation cycle.

In a further advantageous embodiment of the invention it is identified that the characteristic voltage pulse occurs, if an amount of the first voltage value is greater than a predefined threshold voltage. The advantage is that failure of the characteristic voltage pulse to occur can be identified very simply. Also voltage pulses, the amount of which is smaller than or equal to the predefined threshold voltage, are not detected. This means that verification of the coupling state is particularly resistant to disruptive influences.

In a further advantageous embodiment of the invention the steep-edged change in the amount of current flow through the inductive load is triggered by a break in an electric circuit, in which the inductive load is disposed. This has the advantage that the amount of current flow can thus be changed very simply in a steep-edged manner, for example by opening a switch.

In a further advantageous embodiment of the invention the first coupling point is coupled via a diagnosis resistor to a diagnosis potential. A second voltage value is detected between the first and second coupling points within a further time period, during which the inductive load is not activated and during which the voltage is essentially stationary. A type of error is also identified as a function of the second voltage value. The advantage is that it is possible to identify the type of error so very simply and reliably.

In this context it is advantageous if the diagnosis potential lies between a ground potential and an activation potential of the inductive load. This allows reliable identification of the type of error.

In this context it is advantageous, if a short circuit to the ground potential is identified as the type of error, if the second voltage value is lower than a predefined lower voltage threshold value. The short circuit to the ground potential can be identified very simply, if the second voltage value is low, e.g. around a volts.

In a further advantageous embodiment of the invention a short circuit to the activation potential is identified as the type of error, if the second voltage value is greater than a predefined upper voltage threshold value. This has the advantage that the short circuit to the activation potential can be identified very simply, if the second voltage value is large, e.g. approximately equal to an activation voltage, which is a function of the activation potential.

In a further advantageous embodiment of the invention a break in the line to the inductive load is identified as the type of error, if the second voltage value is within a predefined value range as a function of the diagnosis potential. If the line to the inductive load is broken, the inductive load cannot influence the second voltage value. The second voltage value is therefore a function of the diagnosis potential but not of the inductive load. The advantage is that the break in the line to the inductive load can be identified so very simply, if the diagnosis potential is appropriately predefined.

Other features which are considered as characteristic for the invention are set forth in the appended claims.

Although the invention is illustrated and described herein as embodied in a method and device for verifying an electrical coupling state of an inductive load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic of a circuit configuration, a control unit, and an inductive load;

FIG. 2A is a graph showing a pattern over time of a second activation voltage;

FIG. 2B is a graph showing a pattern over time of a load voltage;

FIG. 2C is a graph showing a pattern over time of a load current;

DESCRIPTION OF THE PREFERRED EMBODIMENTS

Figure 3:
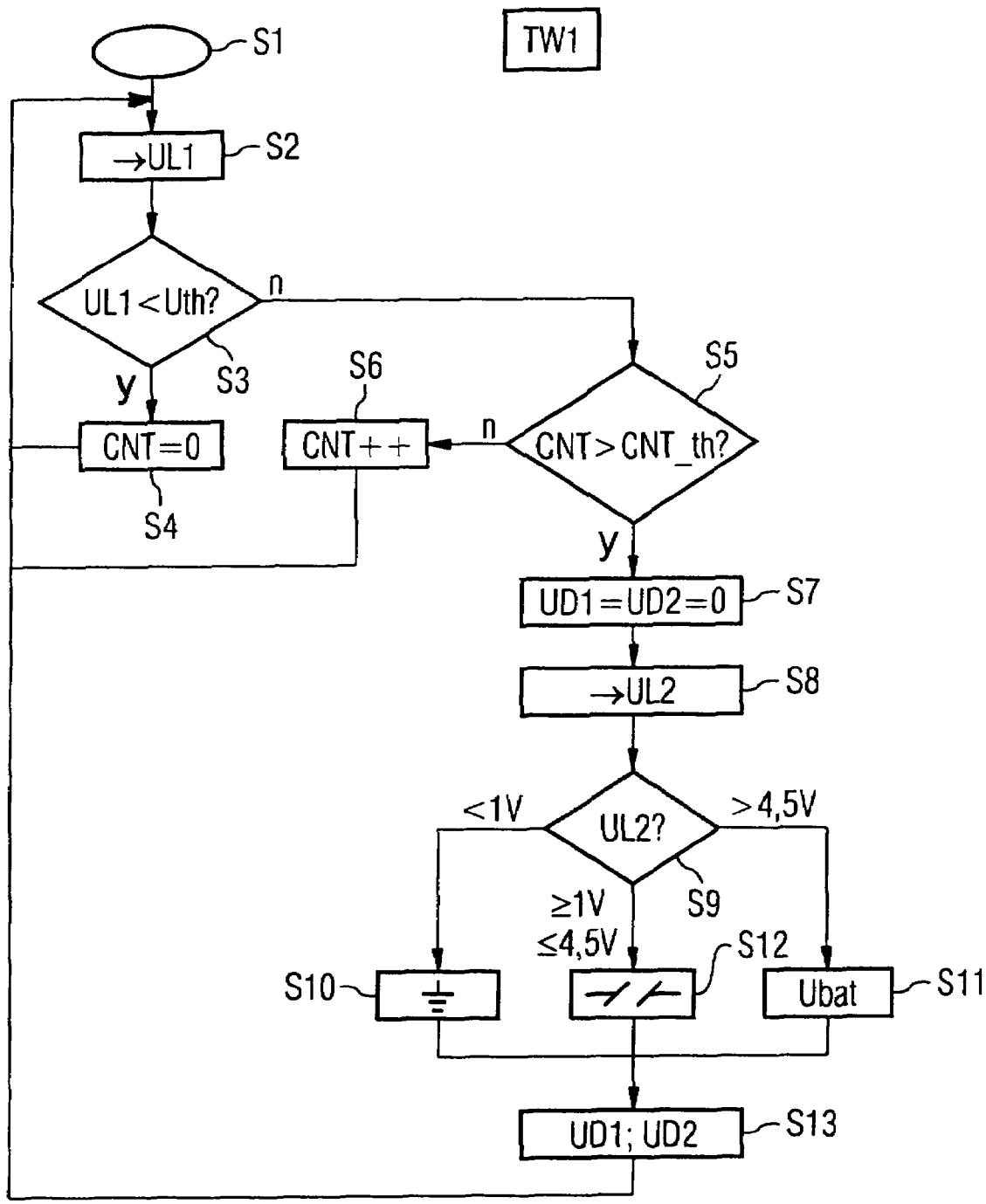
FIG. 3 is a flow diagram of a first program for verifying an electrical coupling state.

Referring now to the figures of the drawing in detail and first, particularly, to FIG. 1 thereof, there is seen a control unit 1, a circuit configuration having a first switch 2 and first and second coupling points (K1, K2), and an inductive load 3. The inductive load 3 is for example an electromagnet of a valve, in particular a high-speed valve, as used for example in vehicle transmission systems. The control unit 1 and the circuit configuration form a device for verifying a coupling state of the inductive load 3 to the circuit configuration.

The control unit 1 is for example configured to control the vehicle transmission system and optionally to control an internal combustion engine in the vehicle or other components in the vehicle.

The control unit 1 is also configured to verify an electrical coupling state between the inductive load 3 and the circuit configuration.

The inductive load 3 is coupled electrically via the first coupling point K1 and the second coupling point K2 to the circuit configuration. The first coupling point K1 is coupled electrically via a load connecting line 4 to the first switch 2. The second coupling point K2 is coupled electrically to a ground potential 5. The first switch 2 is also coupled electrically to an activation potential Ubat, such that a battery voltage from a battery in the vehicle is present between the activation potential Ubat and the ground potential 5. The battery voltage is for example around 12 volts but it can be greater or lower than that.

The circuit configuration also comprises a second switch 6 and a first diode 7, which are disposed electrically between the first coupling point K1 and the second coupling point K2. The second switch 6, the first diode 7 and the inductive load 3 are thus disposed in an electric circuit, which can be opened, or broken, or closed by way of the second switch 6.

The first diode 7 is disposed such that a current flow from the activation potential Ubat through the first switch 2 and through the second switch 6 to the ground potential 5 is not possible when the first switch 2 and the second switch 6 are closed.

The first coupling point K1 and the load connecting line 4 are coupled electrically via a diagnosis resistor 8 to a diagnosis potential Udiag. The first coupling point K1, the load connecting line 4, the diagnosis resistor 8, the first switch 2 and the second switch 6 are also coupled electrically to an analog input 9 of the control unit 1. The control unit 1 comprises an analog-digital converter A/D, which is coupled to the analog input 9.

The control unit 1 can also comprise a digital input 10. The digital input 10 is coupled electrically via a first resistor 11 to an operating potential Ucc and via a series circuit comprising a second resistor 12 and a second diode 13 to the analog input 9. The first resistor 11, the second resistor 12 and the second diode 13 can also be disposed in the control unit 1. An operating voltage of for example around 5 volts is present between the operating potential Ucc and the ground potential 5. The operating voltage can however also be greater than or lower than 5 volts.

The control unit 1 is configured to activate the first switch 2 and the second switch 6. To this end the first switch 2 and the second switch 6 are coupled electrically to activation outputs of the control unit 1. A first activation voltage UD1 is supplied to the first switch 2 by the control unit 1 for activation purposes. A second activation voltage UD2 is supplied correspondingly to the second switch 6. The first switch 2 or second switch 6 opens or closes as a function of the first activation voltage UD1 or the second activation voltage UD2. The first switch 2 and second switch 6 are configured as transistors for example, in particular as field-effect transistors. The first switch 2 or second switch 6 can however also be configured such that they are for example each activated via an activation current, which is supplied to them by the control unit 1.

A load voltage UL is released between the first coupling point K1 and the second coupling point K2, i.e. via the inductive load 3, if this is coupled electrically to the first coupling point K1 and the second coupling point K2, said load voltage UL being able for example to be detected by the analog-digital converter A/D of the control unit 1.

Appropriate activation of the inductive load 3 causes a load current IL to flow in it. A magnetic flux is present in the inductive load 3 as a function of the load current IL. If the magnetic flux in the inductive load 3 is large enough, a valve armature in the valve is attracted, to open the valve. To close the valve, the magnetic flux in the inductive load must be reduced correspondingly to the extent that the valve armature can no longer be held in its position and the valve armature is moved into a position, in which the valve is closed. In particular in the case of high-speed valves, the valve armatures of which have a low level of inertia, the high-speed valve should open and close particularly rapidly. The magnetic flux in the inductive load 3 must be increased or reduced correspondingly rapidly.

FIG. 2A shows a pattern over time of the second activation voltage UD2. The second switch 6 is closed at a connection time ton and opened at a disconnection time toff. The second switch 6 is therefore closed for a hydraulic connection period Thyon, which starts at the connection time ton and ends at the disconnection time toff. If there is no error in the coupling state of the inductive load 3 to the circuit configuration, the electric circuit, in which the inductive load 3, the second switch 6 and the first diode 7 are disposed, is closed.

During the hydraulic connection period Thyon the inductive load 3 or the high-speed valve is activated such that the high-speed valve opens and remains open. After the end of the hydraulic connection period Thyon, i.e. after the disconnection time toff, the high-speed valve is for example activated such that it closes as quickly as possible.

The inductive load 3 and the first coupling point K1 are coupled temporarily via the first switch 2 and the load connecting line 4 to the activation potential Ubat during the hydraulic connection period Thyon. The inductive load 3 can thus be supplied with electrical energy, if there is no error in the coupling state. This results in a current flow through the inductive load 3, the load current IL (FIG. 2C).

The load voltage UL (FIG. 2B) varies according to activation of the inductive load 3 via the first switch 2. The first switch 2 is preferably closed at connection time ton until the load current IL has reached at least a starting current Ion. When the starting current Ion is reached, the magnetic flux in the inductive load 3 is so great that the high-speed valve opens. The load current IL can then be reduced to a holding current Ihold, which is so great that the high-speed valve remains open. The inductive load 3 is then preferably activated via the first switch 2 in a pulse width modulated manner with an electrical period Tel and an electrical connection period Telon. The electrical period Tel should be so short that the valve armature cannot follow the fluctuations in the magnetic flux caused by activation due to its inertia. The electrical period Tel lasts approximately one millisecond but it can be longer or shorter. The pulse duty factor or electrical connection period Telon are preferably selected such that the resulting load current IL corresponds to the holding current Ihold when taken as an average over an electrical period Tel.

While the first switch 2 is open and the second switch 6 is closed, the load current IL of the inductive load 3 can continue to flow through the first diode 7 and the second switch 6. The magnetic flux of the inductive load 3 is thus largely maintained and only drops as a result of any ohmic losses occurring in the electric circuit, which reduce the load current IL.

At disconnection time toff the high-speed valve should close rapidly. This requires the magnetic flux in the inductive load 3 to be reduced rapidly. To this end the first switch 2 and the second switch 6 are opened. Opening the first switch 2 means that the inductive load 3 is not supplied with any further electrical energy. Opening the second switch 6 stops the load current IL flowing through the first diode 7 and the second switch 6, as the electric circuit is broken. This reduces the load current IL very quickly, for example in a few microseconds, i.e. in a steep-edged manner, by a large amount, for example approximately that of the holding current Ihold. As a result the magnetic flux in the inductive load 3 is also reduced. The steep-edged change in the current flow and the magnetic flux causes the inductive load 3 to generate a characteristic voltage pulse 14, preceded by a sign opposite to that of the activation voltage.

The characteristic voltage pulse 14 is the result of the reduction of the magnetic flux in the inductive load 3. The voltage pulse refers to a pattern of voltage over time, away from a neutral voltage, for example 0 volts. The characteristic voltage pulse 14 can be limited by circuit technology to a predefined limit voltage Ulim, e.g.—49 volts.

The high-speed valve is preferably activated such that a mean hydraulic flow through the high-speed valve corresponds to a desired through-flow. To this end the high-speed valve is preferably activated with a hydraulic period Thy. The hydraulic period Thy corresponds to an activation cycle of the high-speed valve or the inductive load 3. The pulse duty factor or the hydraulic connection period Thyon can be used to set the desired through-flow through the high-speed valve. The hydraulic period Thy, the electrical period Tel and the electrical connection period Telon are a function of the mechanical or hydraulic configuration of the high-speed valve.

FIG. 3 shows a flow diagram of a first program to verify the coupling state of the inductive load 3 to the circuit configuration, which is executed for example in the control unit 1. The program starts with a step S1, which is executed for example at the start of operation of the high-speed valve. Any necessary initialization and preparatory steps, e.g. the resetting of a counter CNT to a neutral value, e.g. zero, can be carried out in the step S1.

In a step S2 a first value UL1 is detected for the load voltage UL. In a step S3 it is verified whether the first value UL1 of the load voltage UL is lower than a predefined threshold value Uth. If this condition is satisfied, in a step S4 the counter CNT is set to a neutral value, e.g. zero. The program then continues from step S2.

The step S2 is preferably clocked. The clock cycle is for example predefined by a first waiting period TW1. The first waiting period TW1 lasts for example approximately 1 millisecond but it can however be shorter or longer than that. The predefined threshold voltage Uth is predefined such that the condition in step S3 is reliably satisfied, if the characteristic voltage pulse 14 occurs. However the predefined threshold voltage Uth is also predefined such that the condition in step S3 is not satisfied, if the characteristic voltage pulse 14 does not occur and in the event of any disruptive influences, to which the circuit configuration is exposed. The predefined threshold voltage is around −17 volts, but it can be higher or lower than that.

If the condition in step S3 is not satisfied, the system verifies in a step S5 whether the counter CNT is greater than a predefined threshold value CNT_th. If the counter CNT is lower than or equal to the predefined threshold value CNT_th, the program continues with a step S6. In the step S6 the counter CNT is increased, by one for example. The program is then continued from step S2, optionally after the end of the first waiting period TWI.

If in step S5 the counter CNT is however greater than the predefined threshold value CNT_th, in a step S7 activation of the first switch 2 and the second switch 6, and thus also the inductive load 3, is terminated. The first switch 2 and the second switch 6 should then preferably be opened. Alternatively the first switch 2 and the second switch 6 can also be activated such that they are opened.

In a step S8 a second value UL2 is detected for the load voltage UL. In a step S9 the second value UL2 of the load voltage UL is used to verify a type of error of the coupling state of the inductive load 3. To this end it is verified in which of three value ranges the second value UL2 of the load voltage UL lies. If the second value UL2 of the load voltage UL is small, for example lower than 1 volt, in a step S10 a short circuit to the ground potential is identified. If the second value UL2 of the load voltage UL is however large, for example higher than 4.5 volts, in a step S11 a short circuit to the activation potential Ubat is identified. If the second value UL2 of the load voltage UL is however in a value range between for example 1 volt and 4.5 volts, in a step S12 a break in the line to the inductive load 3 is identified. After step S10, S11 or S12, in a step S13, activation of the first switch 2 and the second switch 6 can be resumed and the program can continue from step S2, optionally after the end of the first waiting period TWI.

The three value ranges, lower than 1 volt, higher than 4.5 volts and between 1 volt and 4.5 volts, are preferably predefined as a function of the diagnosis potential Udiag or the diagnosis voltage. The diagnosis resistor 8 is preferably high-resistance compared with the inductive load 3, which can also comprise an ohmic resistor. When the first switch 2 is opened, if there is no error in the coupling state of the inductive load 3, the diagnosis voltage essentially drops across the diagnosis resistor 8 and the load voltage UL is low, for example less than 1 volt. In the event of a short circuit to the ground potential 5, the diagnosis voltage also essentially drops across the diagnosis resistor 8, such that the load voltage UL is low, for example lower than 1 volt.

In the event of a short circuit to the activation potential Ubat however the load voltage UL has a high value, which is predefined by the activation voltage. Such a short circuit to the activation potential Ubat can for example also result from functional failure of the first switch 2, in that the first switch 2 is also closed, when the first switch 2 is activated such that it should be opened.

In the event of a break in the line to the inductive load 3, the load voltage UL is essentially predefined by the diagnosis voltage Udiag. The diagnosis potential Udiag is therefore preferably predefined such that it lies between the ground potential 5 and the activation potential Ubat. Optionally it should be taken into account that the control unit 1, which is configured to detect the second value UL2 of the load voltage UL, cannot fully detect the value range between the ground potential 5 and the activation potential Ubat. The battery voltage is 12 volts for example. The analog-digital converter AID of the control unit 1 can however optionally only detect voltages between 0 volts and 5 volts. It is then necessary for the diagnosis voltage or the diagnosis potential Udiag to be selected such that it is within the value range that can be detected by the analog-digital converter AID. The diagnosis voltage is then 2.5 volts for example.

The second value UL2 of the load voltage UL can also be detected by means of threshold value switches as an alternative to the analog-digital converter. The three value ranges to distinguish the type of error are then for example predefined by a lower voltage threshold value, e.g. 1 volt, and by an upper voltage threshold value, e.g. 4.5 volts. The threshold value switches switch when the value exceeds or falls below the respective voltage threshold value as a function of the second value UL2 of the load voltage UL. The value range assigned to the second value UL2 of the load voltage UL is then defined by a switch state of the threshold value switches.

The first value UL1 of the load voltage UL can be detected using the analog-digital converter A/D, if said converter is appropriately configured, i.e. the analog-digital converter A/D has an appropriate value range for detecting the characteristic voltage pulse 14 or via a threshold value switch, formed by the first resistor 11, the second resistor 12 and the second diode 13. The first resistor 11 and the second resistor 12 form a voltage divider. The divided voltage is supplied to the digital input 10.

The voltage divider is configured such that a digital low level is generated at the digital input 10 when the characteristic voltage pulse 14 occurs and, if the characteristic voltage pulse 14 does not occur, a digital high level is generated. The predefined threshold voltage Uth can be predefined by appropriate configuration of the voltage divider. It is advantageous that the analog-digital converter A/D does not have to be configured to detect negative voltages to allow detection of the characteristic voltage pulse 14. The occurrence of the characteristic voltage pulse 14 can be detected in step S3 simply by scanning the state of the digital input 10.

The predefined threshold value CNT_th of the counter CNT is preferably defined as a function of the activation cycle or the hydraulic period Thy. The condition in step S5 is preferably satisfied when at least the hydraulic period Thy has elapsed.

Figure 4:
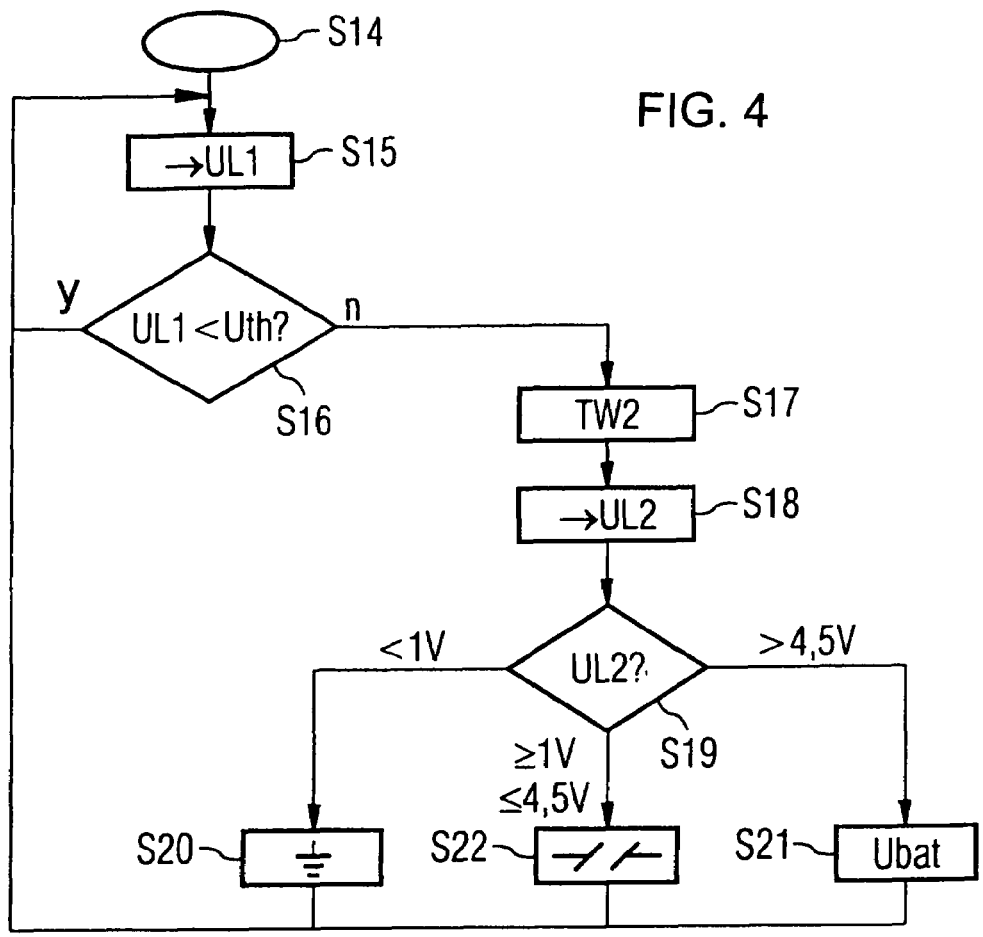
FIG. 4 is a flow diagram of a second program for verifying the electrical coupling state.

FIG. 4 shows the flow diagram of a second program for verifying the coupling state between the circuit configuration and the inductive load 3/starting in a step S14. In a step S15 the first value UL1 of the load voltage UL is detected. The step S15 is preferably detected within a predefinable period, which starts with the steep-edged change in the amount of current flow, i.e. at the disconnection time toff. The first value UL1 of the load voltage UL is preferably detected at a time when the characteristic voltage pulse 14 can be reliably detected, when the coupling state of the inductive load 3 has no error.

In a step S16, which corresponds to the step S3 it is verified whether the first value UL1 of the load voltage UL is smaller than the predefined threshold value Uth. If this condition is satisfied, the program continues in step S15. If the condition is not satisfied however, the program continues in step 17. In step S17 program processing is suspended for a second waiting period TW2. The second waiting period TW2 is preferably predefined such that any voltage pulse present, which does not satisfy the condition in step S16, has died down, the first switch 2 and the second switch 6 are not activated and the load voltage is essentially stationary. The second waiting period TW2 lasts several milliseconds for example.

After the end of the second waiting period TW2 in a step S18 the second value UL2 of the load voltage UL is detected. In a step S19 the second value UL2 of the load voltage UL is verified. Depending on the second value UL2 of the load voltage UL, in a step S20 the short circuit to the ground potential 5 is identified/in a step S21 the short circuit to the activation potential Ubat is identified or in a step S22 the break in the line to the inductive load 3 is identified. The steps S19, S20, S21 and S22 correspond to the step S9, S10, S11 and S12.

The methods for verifying the coupling state of the inductive load 3 shown by the flow diagrams of the first program and the second program are suitable for implementation during the regular operation of the inductive load 3 or the high-speed valve.

Activation of the first switch 2, the second switch 6 or the inductive load 3 does not have to be modified in order to be able to verify the coupling state of the inductive load 3 to the circuit configuration.

Figure 5:
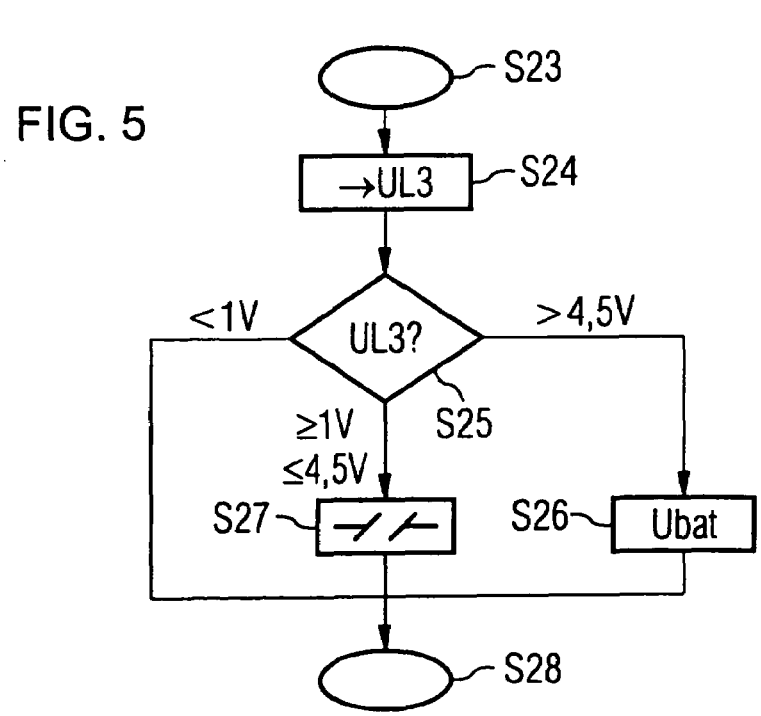
FIG. 5 is a flow diagram of a third program for verifying the electrical coupling state.

A third program, the flow diagram of which is shown in FIG. 5, is by contrast suitable for execution for example before regular operation. The program is started in a step S23. In a step S24 a third value UL3 of the load voltage UL is detected. In a step S25 the third value UL3 of the load voltage UL is verified. Depending on the third value UL3 of the load voltage UL, in a step S26 the short circuit to the activation potential Ubat is identified or in a step S27 the break in the line to the inductive load 3 is identified. The steps S25/S26 and S27 correspond to the steps S9, S11 and S12. After step S26 or S27/or if the third value UL3 of the load voltage UL is lower than for example 1 volt, the program is terminated in a step S28. In step S28 optionally, in particular if no error has been detected in the coupling state, regular operation can be started and step S1 or step S14 can for example be executed.

This application claims the priority, under 35 U.S.C. § 119, of German patent application No. 10 2005 014 210.9, filed Mar. 29, 2005; the disclosure of the prior application is herewith incorporated by reference in its entirety.

We claim:

1. A method of verifying an electrical coupling state between an inductive load and a circuit configuration, the method comprises:
    coupling an inductive load to a circuit configuration via first and second coupling points;
    determining a first voltage value between the first and second coupling points;
    testing the first voltage value for an occurrence of a characteristic voltage pulse that can be triggered by a reduction of a magnetic flux in the inductive load by way of a steep-edged change in an amount of current flow through the inductive load;
    electrically coupling the first coupling point to a diagnosis potential via a diagnosis resistor, and setting the diagnosis potential between a ground potential and an activation potential of the inductive load;
    detecting a second voltage value between the first and second coupling points within a further time period, during which the inductive load is not activated and during which the voltage is substantially stationary;
    identifying an error in the coupling state, if the characteristic voltage pulse does not occur within a predefined time period;
    identifying an absence of an error in the coupling state, if the characteristic voltage pulse occurs; and
    identifying a short circuit to the ground potential, if the second voltage value is lower than a predefined lower voltage threshold value.

2. The method according to claim 1, which comprises starting the predefined time period with the steep-edged change in the amount of current flow.

3. The method according to claim 1, wherein the predefined time period includes at least one activation cycle of the inductive load.

4. The method according to claim 1, which comprises determining that the characteristic voltage pulse occurs, if the amount of the first voltage value is greater than a predefined threshold voltage.

5. The method according to claim 1, wherein the steep-edged change in the amount of current flow through the inductive load is triggered by a break in an electric circuit in which the inductive load is connected.

6. The method according to claim 1, which comprises identifying the error as a short circuit to the activation potential of the inductive load, if the second voltage value is greater than a predefined upper threshold voltage value.

7. The method according to claim 1, which comprises identifying the error as a break in a line to the inductive load, if the second voltage value lies within a predefined value range in dependence on the diagnosis potential.

8. A device for monitoring an electrical coupling state between an inductive load and a circuit configuration having first and second coupling points for coupling to the inductive load, comprising:
    means to detect a first voltage value between the first and second coupling points;
    means to test the first voltage value for an occurrence of a characteristic voltage pulse, the characteristic voltage pulse being triggered by a decrease in a magnetic flux in the inductive load by way of a steep-edged change in an amount of current flow through the inductive load;
    means for electrically coupling the first coupling point to a diagnosis potential via a diagnosis resistor, and setting the diagnosis potential between a ground potential and an activation potential of the inductive load;
    means for detecting a second voltage value between the first and second coupling points within a further time period, during which the inductive load is not activated and during which the voltage is substantially stationary; and
    means for identifying:
        an error in the coupling state, if the characteristic voltage pulse does not appear within a predefined time period;
        no error in the coupling state, if the characteristic voltage pulse is present; and a short circuit to the ground potential, if the second voltage value is lower than a predefined lower voltage threshold value.

9. A device for monitoring an electrical coupling state between an inductive load and a circuit configuration having first and second coupling points for coupling to the inductive load, comprising:

a monitoring device to:
- monitor an electrical coupling state between an inductive load and a circuit configuration having first and second coupling points for coupling to the inductive load;
- detect a first voltage value between the first and second coupling points;
- test the first voltage value for an occurrence of a characteristic voltage pulse, the characteristic voltage pulse being triggered by a decrease in a magnetic flux in the inductive load by way of a steep-edged change in an amount of current flow through the inductive load;
- electrically couple the first coupling point to a diagnosis potential via a diagnosis resistor, and set the diagnosis potential between a ground potential and an activation potential of the inductive load;
- detect a second voltage value between the first and second coupling points within a further time period, during which the inductive load is not activated and during which the voltage is substantially stationary;
- identify a presence of an error in the coupling state, if the characteristic voltage pulse does not appear within a predefined time period;
- identify a presence of no error in the coupling state, if the characteristic voltage pulse does appear within the predefined time period; and
- identify a short circuit to the ground potential, if the second voltage value is lower than a predefined lower voltage threshold value.

* * * * *